United States Patent [19]

Chao

[11] Patent Number: 5,633,191
[45] Date of Patent: May 27, 1997

[54] PROCESS FOR MINIMIZING ENCROACHMENT EFFECT OF FIELD ISOLATION STRUCTURE

[75] Inventor: Fang-Ching Chao, Hsinchu, Taiwan

[73] Assignee: United Microelectronics, Corp., Hsinchu, Taiwan

[21] Appl. No.: 699,608

[22] Filed: Aug. 19, 1996

[51] Int. Cl.⁶ .................................................. H01L 21/76
[52] U.S. Cl. .......................... 438/448; 438/449; 438/451
[58] Field of Search .................................. 437/69, 70, 72, 437/73

[56] References Cited

U.S. PATENT DOCUMENTS

| | | | |
|---|---|---|---|
| 4,755,477 | 7/1988 | Chao | 437/73 |
| 5,104,829 | 4/1992 | Shida | 437/70 |
| 5,208,181 | 5/1993 | Chi | 437/70 |
| 5,358,893 | 10/1994 | Yang et al. | 437/69 |
| 5,397,733 | 3/1995 | Jang | 437/70 |

Primary Examiner—Trung Dang
Attorney, Agent, or Firm—Christensen, O'Connor, Johnson & Kindness

[57] ABSTRACT

A method for minimizing the impurity encroachment effect of field isolation structures for NMOS, PMOS and CMOS integrated circuits is disclosed. In the process, a polysilicon layer is deposited on a laminate comprising a substrate having thereon a pad oxide, and the stacked layers on the pad oxide. An overhang layer is deposited on the polysilicon layer, and a photo-resist mask which masks the active regions is then applied so as to remove the unmasked overhang layer and the unmasked polysilicon layer. The resultant structure is isotropically etched to partially undercut the vertical portions of the polysilicon layer under the overhang layer so as to form an overhang. The photo-resist is stripped, and the stacked layers not covered by the overhang layer are etched anisotropically. The channel-stop ions are implanted, and the overhang layer is removed. Anisotropically etch the stacked layers by using the polysilicon layer as a mask, and then the resultant structure is subjected to oxidation to form the isolation regions. The channel stop region is self-aligned to the resultant field oxide and the isolation structure is free of the impurity encroachment effect.

30 Claims, 8 Drawing Sheets

PROCESS FOR MINIMIZING ENCROACHMENT EFFECT OF FIELD ISOLATION STRUCTURE

BACKGROUND OF THE INVENTION

1. Field of the Invention

The present invention relates to a method for forming the isolation regions among devices on a semiconductor substrate, and more particularly to a method for forming the field isolation structure with the minimized impurity encroachment effect.

2. Description of the Prior Art

The art of isolating devices that are built on a semiconductor substrate becomes one important aspect of modem metal-oxide-semiconductor (MOS) and bipolar integrated circuit technology as many as hundreds of thousands of devices are used in a single chip. Improper isolation among transistors will cause current leakages, which can consume significant power for the entire chip. In addition, improper isolation can further escalate latchup to damage the circuit function momentarily or permanently. Still further, improper isolation can result in noise margin degradation, voltage shift or crosstalk. In complementary MOS (CMOS) technology, adequate isolation provided between opposite-type transistors is important as well as between same-type transistors.

In MOS technology, isolation is usually practiced by forming the isolation regions between neighboring active regions. Typically, an isolation region is formed by ion-doping a channel stop of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, making surface inversion not occur under the field oxide region.

The conventional LOCOS (LOCal Oxidation of Silicon) process is used to develop regions which laterally isolate the active devices on the integrated circuits. The LOCOS structure is typically formed by using a patterned silicon nitride layer together with a pad oxide, which is utilized to release stress caused by the silicon nitride layer, underneath to mask the active regions, followed by ion-implantation in the isolation region and then growing a thick field oxide locally. Another structure similar to the LOCOS is the Buffered Polysilicon LOCOS (BPL) isolation process, which uses a sandwich of a pad oxide having thereon a polysilicon layer, and a silicon nitride layer on the polysilicon layer.

Both structures mentioned above possess some inherent drawbacks resulting from the processes, i.e., lateral oxidation of the silicon underneath the silicon nitride mask, making the edge of the field oxide resemble a bird's beak, and the lateral diffusion of channel-stop dopants, making the dopants encroach into the active device regions. Both effects overtake the active device regions, making the physical channel width less than the desired channel width. The reduced portion overtaken by both effects will make the situation even worse when devices are scaled down for very large scale integration (VLSI) implementation, increasing threshold voltage and reducing the current driving capability. Furthermore, p-channel devices and n-channel devices in CMOS process require extra steps strictly to achieve the isolation between the opposite-type devices as well as between the same-type devices.

Several methods in the prior art have been designed for improving LOCOS or BPL isolation processes to minimize the transition regions between active areas. For example, the side wall masked isolation (SWAMI) process has been proposed which involves the addition of a second silicon nitride layer on the side wall. The SWAMI offers basically near-zero bird's beak, but at the expense of process complexity. Another method in the prior art is the sealed-interface local oxidation (SILO) process which uses three layers of a silicon nitride over the silicon substrate followed by an oxide layer and a cap silicon nitride layer. The SILO can reduce the bird's beak, but at the expense of generating more stress, more crystal defects, and higher leakage currents. Also, the buried oxide (BOX) process has been devised which uses an aluminum mask to etch a silicon groove and the subsequent removal of a plasma deposited silicon dioxide layer. The BOX process can reduce the bird's beak but, however, at the expense of manufacture complexity. Although numerous techniques have been devised for improving the LOCOS or the BPL isolation process to minimize bird's beak effect, none of these effectively overcomes the dopant encroachment problems.

SUMMARY OF THE INVENTION

It is therefore a primary object of this invention to provide an improved method for minimizing the encroachment effect of field isolation structures.

It is another object of the invention to provide an improved method of the local oxidation of silicon (LOCOS) and the buffered polysilicon LOCOS (BPL) structures.

It is a further object of the present invention to provide a method for forming the field isolation structure with self-aligned channel stop regions for N-channel MOS (NMOS), P-channel MOS (PMOS) and CMOS integrated circuits.

According to the present invention, an improved method is provided to define isolation structures between active regions with minimized impurity encroachment effects, i.e., the lateral diffusion of implanted ions due to oxidation processes during the formation of isolation regions. This technique finds several applications in the processing of silicon wafers for NMOS, PMOS or CMOS integrated circuits. The term MOS is used herein to include silicon gate technology.

In the process, a polysilicon layer is deposited on a laminate comprising a substrate having thereon a pad oxide, and the stacked layers on the pad oxide. An overhang layer is deposited on the polysilicon layer, and a photo-resist mask which masks the active regions is then applied so as to remove the unmasked overhang layer and the unmasked polysilicon layer. The resultant structure is isotropically etched to partially undercut the vertical portions of the polysilicon layer under the overhang layer so as to form an overhang. The photo-resist is stripped, and the stacked layers not covered by the overhang layer are etched anisotropically. The channel-stop ions are implanted, and the overhang layer and the polysilicon layer are removed. The resultant structure is subjected to oxidation to form the isolation regions. The channel stop region is self-aligned to the resultant field oxide and the isolation structure is free of the impurity encroachment effect.

DESCRIPTION OF THE PREFERRED EMBODIMENTS

Figure 1A:
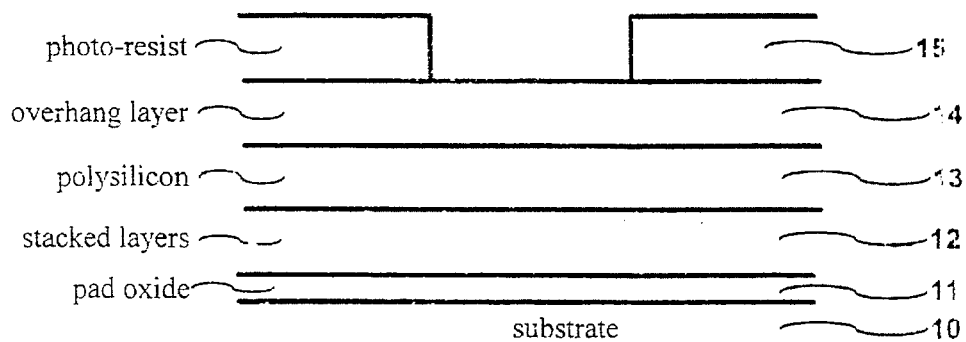
FIGS. 1A to 1F schematically show the steps for forming an isolation region according to one embodiment of the present invention.
Figure 1B:
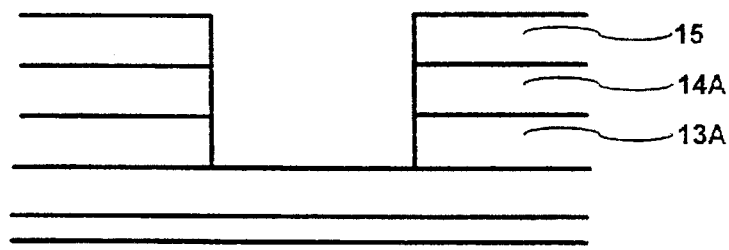
Figure 1C:
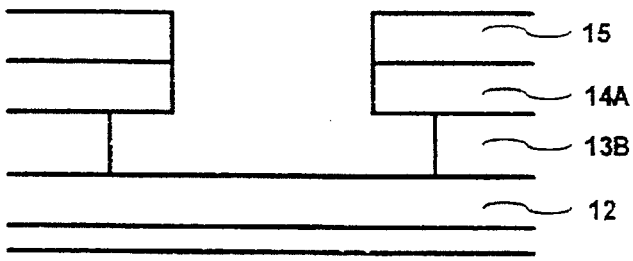

FIGS. 1A to 1F illustrate one embodiment of the present invention. FIG. 1A represents the initial step wherein a substrate 10 has grown thereon a pad oxide 11 in any suitable process, such as, for example, steam-oxygen ambient at about 850° C. The stacked layers 12 are deposited on the pad oxide 11. A polysilicon layer 13 is deposited on the stacked layers 12, having a thickness of about 2000Å using a conventional process, such as, for example, chemical vapor deposition (CVD). An overhang layer 14, e.g., a CVD silicon nitride layer of about 2000Å, is deposited on the polysilicon layer 13. Then a photo-resist 15 is used to mask active regions on the overhang layer 14, so as to remove the unmasked overhang layer 14 and the unmasked polysilicon layer 13, resulting the structure shown in FIG. 1B. The next step in the process as shown in FIG. 1C is the selective isotropic etching of the resultant structure of FIG. 1B by, for example, a dilute HF solution, to remove portions of the polysilicon layer 13A under the overhang layer 14A so as to form an overhang of the overhang layer 14A over the polysilicon layer 13B. The overhang is used for aligning the channel stop to the field oxide as described hereinafter.

Figure 1D:
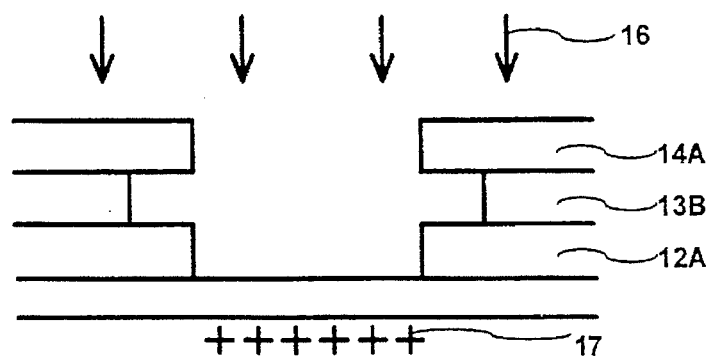

After the overhang forming step, the photo-resist 15 is stripped, and the stacked layers 12 which are not covered by the overhang layer 14A are etched anisotropically, resulting the structure as shown in FIG. 1D. The resultant structure is next subjected to the ion implantation 16 of the appropriately charged ions, for example boron ions, to form the channel-stop. As a result, the ion-implanted region 17 self-aligned to the edges of the overhang layer 14, which substantially reduces the impurity encroachment effect.

Figure 1E:
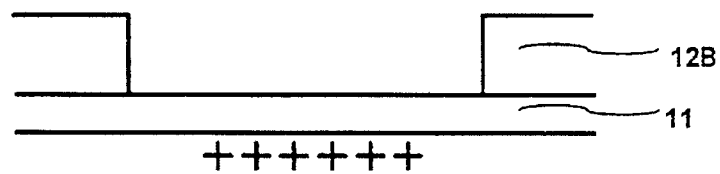
Figure 1F:
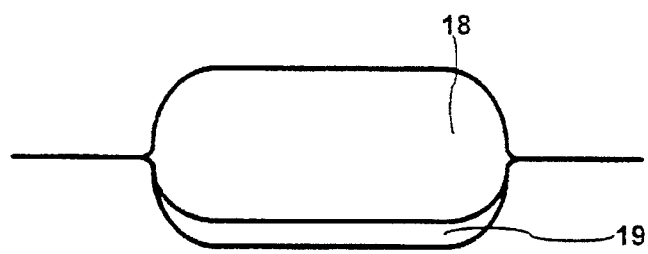

After the ion-implantation step, the overhang layer 14A is removed, and the stacked layers 12B is etched anisotropically by using the polysilicon layer 13B as a mask. The polysilicon layer 13B is removed by a dilute HF, and then the resultant structure shown in FIG. 1E is subjected to a conventional oxidation process to form a field oxide region 18, which is typically about 3000~10000Å. As a result, the channel stop 19 substantially reduces the impurity encroachment effect as shown in FIG. 1F. The final step in the process is the removal of the stacked layers 12B and the pad oxide 11.

Figure 2A:
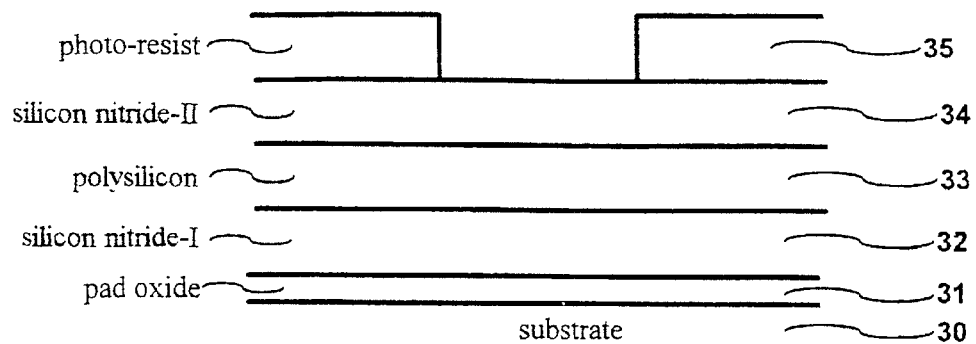
FIGS. 2A to 2J schematically show the steps for forming an isolation region for the LOCOS structure according to another embodiment of the present invention.
Figure 2B:
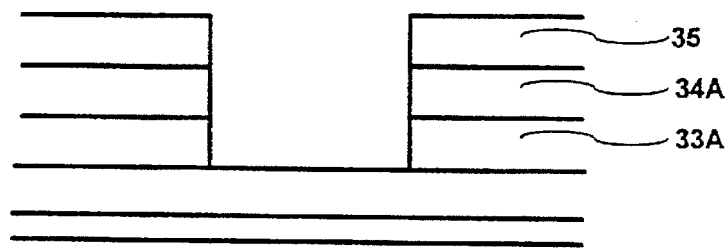
Figure 2C:
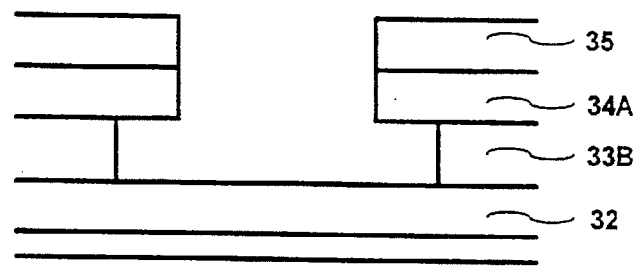

FIGS. 2A to 2J illustrate another preferred embodiment of the present invention for forming the isolation regions of the LOcal Oxidation of Silicon (LOCOS). FIG. 2A represents the initial step wherein a substrate 30 has grown thereon a pad oxide 31 having a thickness of about 300~600Å. A silicon nitride-I layer 32 in thickness of about 1000~2000Å is deposited by way of CVD on the pad oxide 31. A CVD polysilicon layer 33 is deposited on the silicon nitride-I layer 32, having a thickness of about 2000Å, although any suitable thickness can be used. A silicon nitride-II layer 34, having a thickness of about 1000Å is deposited by way of CVD on the polysilicon layer 33. Then a photo-resist 35 is used to mask active regions on the silicon nitride-II layer 34 to pattern the silicon nitride-II layer 34 and the polysilicon layer 33, resulting the structure shown in FIG. 2B. The next step in the process, as shown in FIG. 2C, is the isotropic etching of the resultant structure of FIG. 2B in, for example, a dilute HF solution, to remove portions of the polysilicon layer 33A under the silicon nitride-II layer 34A so as to form an overhang of the silicon nitride-II layer 34A approximately 2000Å over the polysilicon layer 33B. The overhang is used for aligning the channel stop to the field oxide described hereinafter.

Figure 2D:
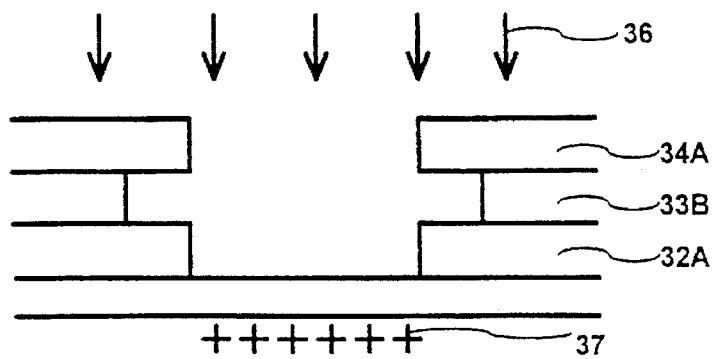

After the overhang forming step, the photo-resist 35 is stripped, and the silicon nitride-I layer 32 not covered by the silicon nitride-II layer 34A are etched anisotropically in, for example, a solution of HF buffered with $NH_4F$, which is usually called buffered-oxide etch (BOE), resulting the structure shown in FIG. 2D. The resultant structure is next subjected to the ion implantation 36, e.g., boron ions implantation for fabricating the isolation regions between n-channel devices. As a result, the ion-implanted region 37 is self-aligned to the edges of the silicon nitride-II layer 34A, which substantially reduces the impurity encroachment effect. Although ion implantation of boron ions is described, any suitable dopant may be used.

Figure 2E:
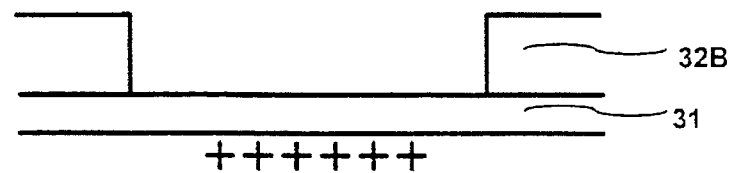
Figure 2F:
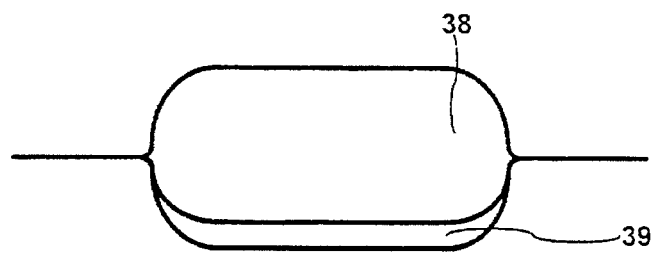

After the ion-implantation step, the silicon nitride-II layer 34A is removed, and the first silicon nitride layer 32A is etched anisotropically by using the polysilicon layer 33B as a mask. The polysilicon layer 33B is removed, and then the resultant structure, shown in FIG. 2E, is subjected to a standard thermal oxidation process to form a field oxide region 38, which is typically about 3000~10000Å. As a result, the channel stop 39 substantially reduces the impurity encroachment effect as shown in FIG. 2F. The final step in the process is the removal of the silicon nitride-I layer 32A and the pad oxide 31 in a boiling $H_3PO_4$ and in a dilute HF solution respectively.

Figure 2G:
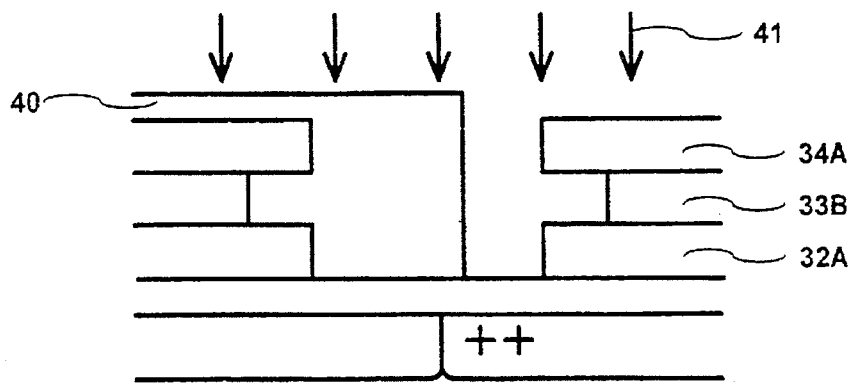
Figure 2H:
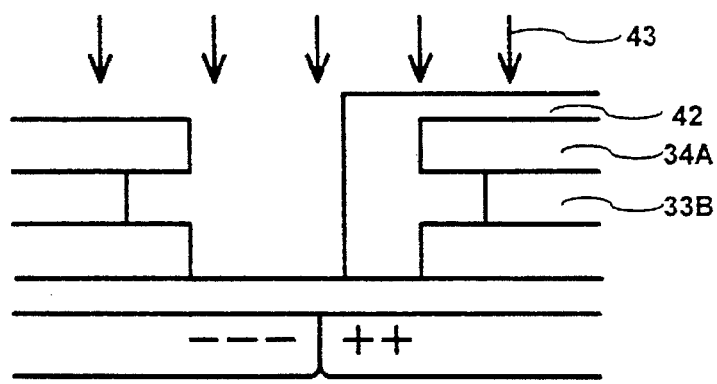

In a CMOS device fabrication process, an extra step and some more masks are required to isolate both the n-type and the p-type devices on the same chip. After the structure shown in FIG. 2C is formed, the isolation regions are formed as shown in FIGS. 2G to 2J. For clarity of the following description, the twin-well method is used while it is well understood that other methods, such as using the n-well on the p-type substrate or using the p-well on the n-type substrate, could be applied equally. Referring to FIG. 2G, the active regions of the p-type devices are masked by the photo-resist 40, which is removed after the ions 41 of p-type, e.g., boron ions, are implanted. Then, as shown in FIG. 2H, the active regions of the n-type devices are masked by the photo-resist 42, which is removed after the ions 43 of n-type, e.g., phosphorus ions, are implanted. Because the pile-up effect of the n-type impurity during oxidation will increase the impurity profile in silicon, the step described in FIG. 2H is usually omitted except when fabricating the high voltage devices.

Figure 2I:
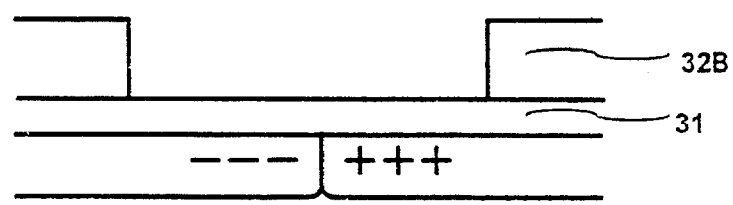
Figure 2J:
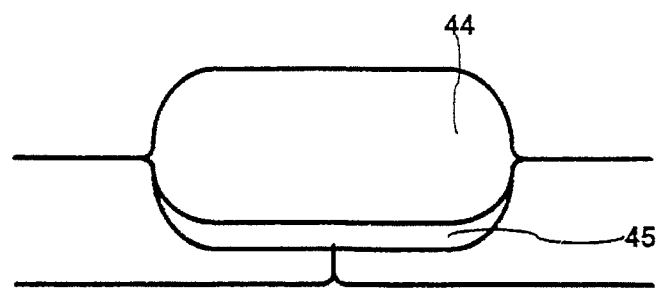

After the ion-implantation step, the silicon nitride-II layer 34A is removed, and the first silicon nitride layer 32A is etched anisotropically by using the polysilicon layer 33B as a mask. The polysilicon layer 33B is removed, and then the resultant structure shown in FIG. 2I is subjected to thermal oxidation to form a field oxide region 44, which is typically about 3000~10000Å, and a channel stop region 45 without the impurity encroachment effect as shown in FIG. 2J. The final step in the process is the removal of the silicon nitride-I layer 32A and the pad oxide 31.

Figure 3A:
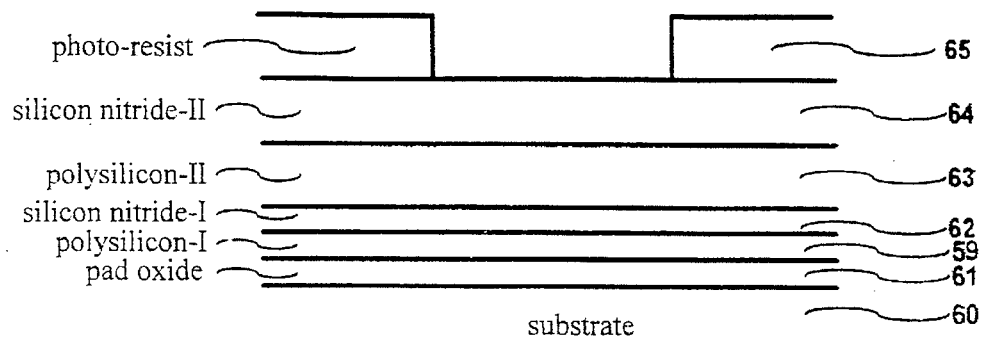
FIGS. 3A to 3J schematically show the steps for forming an isolation region for the BPL structure according to another embodiment of the present invention.
Figure 3B:
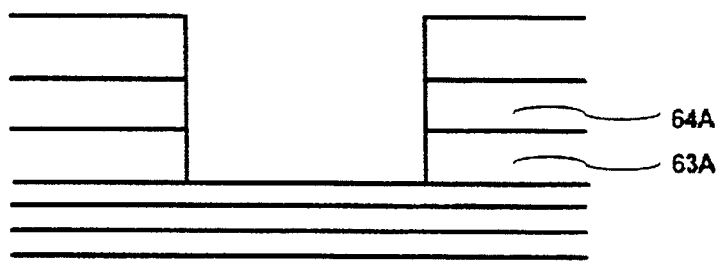
Figure 3C:
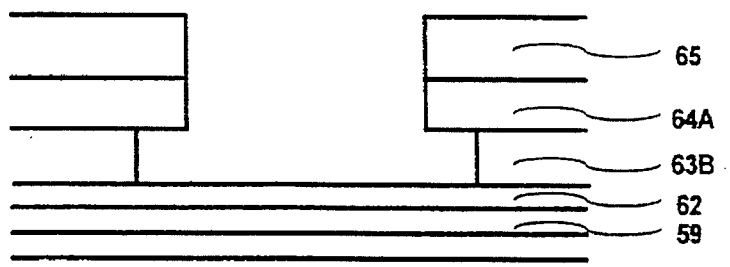

FIGS. 3A to 3J illustrate another preferred embodiment of the present invention for forming the isolation regions of the Buffered Polysilicon LOCOS (BPL) structure. FIG. 3A represents the initial step wherein a substrate 60 has grown thereon a pad oxide 61 having a thickness of about 100~300Å. A polysilicon-I layer 59 in about thickness of 250~400Å is deposited by way of CVD on the pad oxide 61, and a silicon nitride-I layer 62 in thickness of about 1000–2000Å is deposited by way of CVD on the polysilicon-I layer 59. A polysilicon-II layer 63 is deposited on the silicon nitride-I layer 62, having a thickness of about 2000Å. A CVD silicon nitride-II layer 64 is deposited on the polysilicon-II layer 63, having a thickness of about 2000Å. Then a photo-resist 65 is used to mask active regions on the silicon nitride-II layer 64 to pattern the silicon nitride-II layer 64 and the polysilicon-II layer 63, resulting the structure shown in FIG. 3B. The next step in the process, as shown in FIG. 3C, is the isotropic etching of the resultant structure of FIG. 3B in, for example, a dilute HF solution, to remove portions of the polysilicon-II layer 63A under the silicon nitride-II layer 64A so as to form an overhang of the silicon nitride-II layer 64A approximately 2000Å over the polysilicon-II layer 63B. The overhang is used for aligning the channel stop to the field oxide described hereinafter.

Figure 3D:
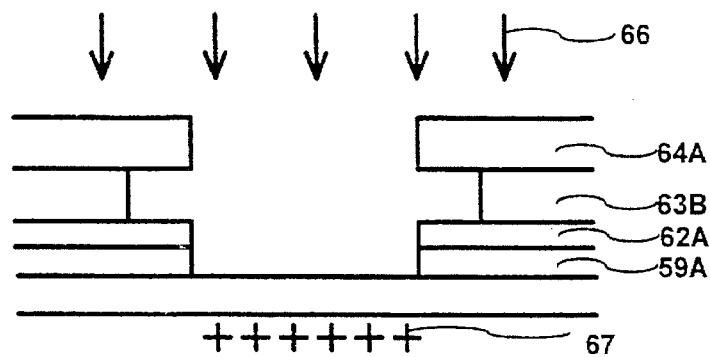

After the overhang forming step, the photo-resist 65 is stripped, and the silicon nitride-I layer 62 and the polysilicon-I layer 59 not covered by the silicon nitride-II layer 64 are etched anisotropically in, for example, BOE solution, resulting the structure shown in FIG. 3D. The resultant structure is next subjected to the ion implantation 66, e.g., boron ions implantation for fabricating the isolation regions between n-channel devices. As a result, the ion-implanted region 67 is self-aligned to the edges of the silicon nitride-II layer 64A, which substantially reduces the impurity encroachment effect. Although ion implantation of boron ions is described, any suitable dopant may be used.

Figure 3E:
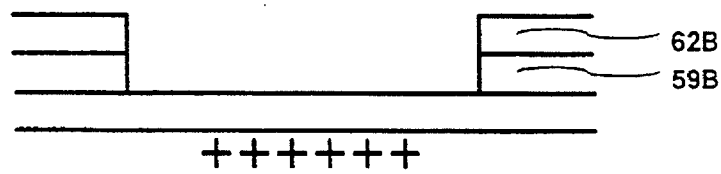
Figure 3F:
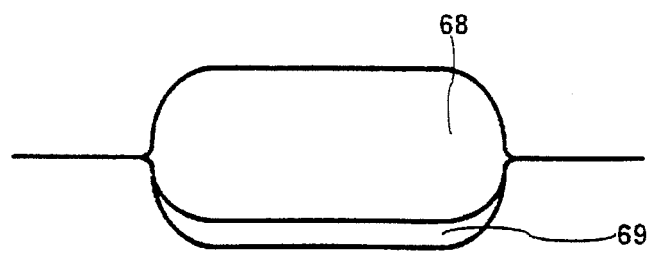

After the ion-implantation step, the silicon nitride-II layer 64A is removed, and the first silicon nitride layer 62A and the first polysilicon layer 59A are etched anisotropically and by using the second polysilicon layer 63B as a mask. The second polysilicon layer 63B is removed, and then the resultant structure, shown in FIG. 3E, is subjected to a standard thermal oxidation process to form a field oxide region 68, which is typically about 3000–10000Å. As a result, the channel stop region 69 substantially reduces the impurity encroachment effect as shown in FIG. 3F. The final step in the process is the removal of the silicon nitride-I layer 62B, the polysilicon-I layer 59B and the pad oxide 61 in a boiling $H_3PO_4$ for etching the silicon nitride-I layer 62B, and in a dilute HF solution for etching the polysilicon-I layer 59B and the pad oxide 61.

Figure 3G:
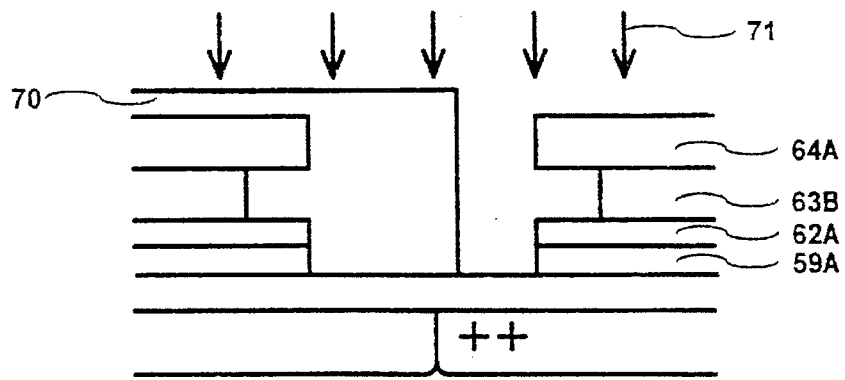
Figure 3H:
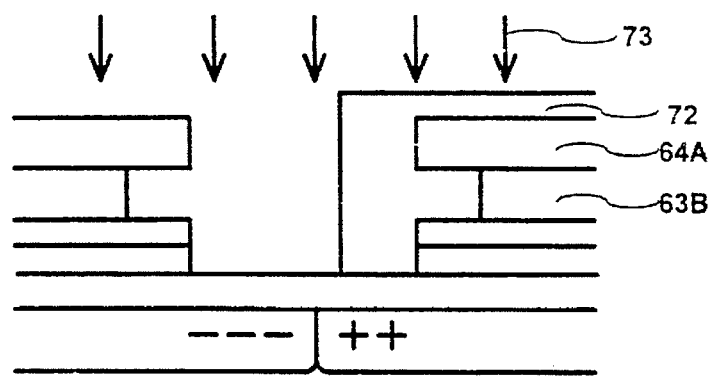

In a CMOS devices fabrication process, an extra step and some masks are required to isolate both the n-type and the p-type devices on the same chip. After the structure shown in FIG. 3C is formed, the isolation regions are formed as shown in FIGS. 3G to 3J. For clarity of the following description, the twin-well method is used while it is well understood that other methods, such as using the n-well on the p-type substrate or using the p-well on the n-type substrate, could be applied equally well. Referring to FIG. 3G, the active regions of the p-type devices are masked by the photo-resist 70, which is removed after the ions 71 of p-type, e.g., boron ions, are implanted. Then, as shown in FIG. 2H, the active regions of the n-type devices are masked by the photo-resist 72, which is removed after the ions 73 of n-type, e.g., phosphorus ions, are implanted. Because the pile-up effect of the n-type impurity during oxidation will increase the impurity profile in silicon, the step described in FIG. 3H is usually omitted except when fabricating the high voltage devices.

Figure 3I:
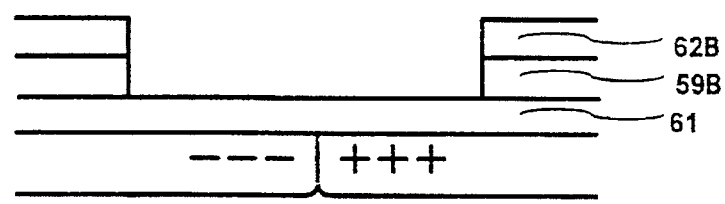
Figure 3J:
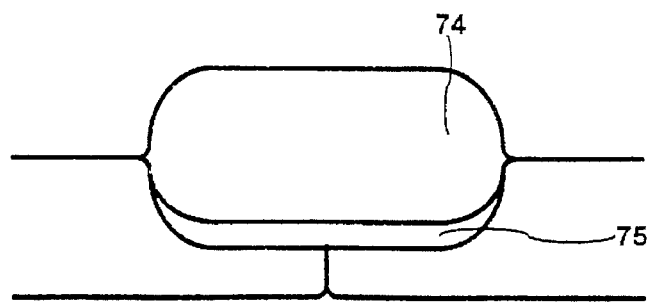

After the ion-implantation step, the silicon nitride-II layer 64A is removed, and the first silicon nitride layer 62A and the first polysilicon layer 59A are etched anisotropically and by using the second polysilicon layer 63B as a mask. The second polysilicon layer 63B is removed, and then the resultant structure shown in FIG. 3I is subjected to thermal oxidation to form a field oxide region 74, which is typically about 3000–10000Å, and a channel stop region 75 without the impurity encroachment effect as shown in FIG. 3J. The final step in the process is the removal of the silicon nitride-I layer 62B, the polysilicon-I layer 59B and the pad oxide 61.

The specific embodiments described above are illustrative of the principles of the invention and are not intended to limit the invention to the embodiments described. For example, stacked layers different from those described may be used in other embodiments. Of course, different dopants in different dosage and layers of different thickness may be used in other embodiments. Accordingly, although specific embodiments have been illustrated and described, it will be obvious to those skilled in the art that various modification may be made without departing from the spirit and the scope of the invention, which is intended to be limited solely by the appended claims.

What is claimed is:

1. A process for forming isolation regions on a semiconductor substrate, the process comprising:

forming a polysilicon layer on a laminate comprising a substrate having thereon a pad oxide, and stacked layers on the pad oxide;

forming an overhang layer on the polysilicon layer;

forming an active region photo-resist mask on the overhang layer;

removing unmasked portions of the overhang layer and the polysilicon layer;

isotropically etching the polysilicon layer under the overhang layer so as to form an overhang of said overhang layer over said polysilicon layer;

removing the photo-resist mask;

anisotropically etching the stacked layers to remove portions thereof not covered by the overhang layer to expose a portion of the pad oxide;

implanting ions into a portion of the substrate, wherein the overhang layer serving as an implant mask;

removing the overhang layer;

anisotropically etching the stacked layers, wherein the polysilicon layer serving as an etching mask; and oxidation so as to form the isolation regions.

2. The process according to claim 1 further comprising, after oxidation, removing the stacked layers and the pad oxide.

3. The process according to claim 1, wherein said overhang layer is a silicon nitride layer.

4. The process according to claim 1, wherein said stacked layers comprise a silicon nitride layer.

5. The process according to claim 1, wherein said stacked layers comprise a second polysilicon layer and a silicon nitride layer on the second polysilicon layer.

6. A process for forming isolation regions on a semiconductor substrate, the process comprising:

forming a polysilicon layer on a laminate comprising a substrate having thereon a pad oxide, and a first silicon nitride layer on the pad oxide;

forming a second silicon nitride layer on the polysilicon layer;

forming an active region photo-resist mask on the second silicon nitride layer;

removing the unmasked portions of the second silicon nitride layer and the polysilicon layer;

isotropically etching the polysilicon layer under the second silicon nitride layer so as to form an overhang of said second silicon nitride layer over said polysilicon layer;

removing the photo-resist mask;

anisotropically etching the first silicon nitride layer to remove the portion thereof not covered by the second silicon nitride layer;

implanting ions of a first type into a portion of the substrate, wherein the second silicon nitride layer serving as an implant mask;

removing the second silicon nitride layer;

anisotropically etching the first silicon nitride layer, wherein the polysilicon layer serving as an etching mask; and oxidation so as to form the isolation regions.

7. The process according to claim 6 further comprising, after oxidation, removing the first silicon nitride layer and the pad oxide.

8. The process according to claim 6, wherein the thickness of the pad oxide is 300~600Å.

9. The process according to claim 6, wherein the thickness of the first silicon nitride layer is 1000~2000Å.

10. The process according to claim 6, wherein the thickness of the polysilicon is about 2000Å.

11. The process according to claim 6, wherein the thickness of the second silicon nitride is 1000~2000Å.

12. The process according to claim 6, wherein said substrate is of p-type and said implanted ions are of p-type.

13. The process according to claim 12, wherein said substrate is of n-type and said implanted ions are of n-type.

14. The process according to claim 6, wherein said substrate comprises n-type regions and p-type regions.

15. The process according to claim 14, wherein said substrate is of n-type or of p-type.

16. The process according to claim 15 further comprising, before implanting the ions of the first type, masking active regions of the first type, and removing the first-type active region mask after the ions of the first type are implanted.

17. The process according to claim 15 further comprising, after said ions of the first type are implanted, masking active regions of a second type, implanting ions of the second type, and removing the second-type active region mask.

18. A process for forming isolation regions on a semiconductor substrate, the process comprising:

forming a second polysilicon layer on a laminate comprising a substrate having thereon a pad oxide, a first polysilicon on the pad oxide, and a first silicon nitride layer on the first polysilicon layer;

forming a second silicon nitride layer on the second polysilicon layer;

forming an active region photo-resist mask on the second silicon nitride layer;

removing the unmasked portions of the second silicon nitride layer and the second polysilicon layer;

isotropically etching the second polysilicon layer under the second silicon nitride layer so as to form an overhang of said second silicon nitride layer over said second polysilicon layer;

removing the photo-resist mask;

anisotropically etching the first silicon nitride layer and the first polysilicon layer to remove the portions thereof not covered by the second silicon nitride layer to expose a portion of the pad oxide;

implanting ions of a first type into a portion of the substrate, wherein the second silicon nitride layer serving as an implant mask;

removing the second silicon nitride layer;

anisotropically etching the first silicon nitride layer and the first polysilicon layer, wherein the second polysilicon serving as an etching mask; and oxidation so as to form the isolation regions.

19. The process according to claim 18 further comprising, after oxidation, removing the first silicon nitride layer, the first polysilicon layer and the pad oxide.

20. The process according to claim 18, wherein the thickness of the pad oxide is 100~300Å.

21. The process according to claim 18, wherein the thickness of the first polysilicon is 250~400Å.

22. The process according to claim 18, wherein the thickness of the first silicon nitride layer is 1000~2000Å.

23. The process according to claim 18, wherein the thickness of the second polysilicon is about 2000Å.

24. The process according to claim 18, wherein the thickness of the second silicon nitride is about 2000Å.

25. The process according to claim 18, wherein said substrate is of p-type and said implanted ions are of p-type.

26. The process according to claim 25, wherein said substrate is of n-type and said implanted ions are of n-type.

27. The process according to claim 18, wherein said substrate comprises n-type regions and p-type regions.

28. The process according to claim 27, wherein said substrate is of n-type or of p-type.

29. The process according to claim 28 further comprising, before implanting the ions of the first type, masking active regions of the first type, and removing the first-type active region mask after the ions of the first type are implanted.

30. The process according to claim 29 further comprising, after said ions of the first type are implanted, masking active regions of a second type, implanting ions of the second type, and removing the second-type active region mask.

* * * * *